United States Patent [19]

Saeki et al.

[11] Patent Number: 4,486,753
[45] Date of Patent: Dec. 4, 1984

[54] BUS LINE DRIVE CIRCUIT

[75] Inventors: Yukihiro Saeki; Kazuyuki Uchida, both of Yokohama, Japan

[73] Assignee: Tokyo Shibaura Denki Kabushiki Kaisha, Japan

[21] Appl. No.: 398,892

[22] Filed: Jul. 16, 1982

[30] Foreign Application Priority Data

Aug. 21, 1981 [JP] Japan ................................ 56-131002

[51] Int. Cl.³ .......................... H04Q 9/00; H03K 5/08
[52] U.S. Cl. ................................ 340/825.91; 307/568; 307/242
[58] Field of Search .................... 340/825.85, 825.91; 365/203, 204; 307/242, 568, 577

[56] References Cited

U.S. PATENT DOCUMENTS

| 3,806,880 | 4/1974 | Spence | 340/825.91 |
| 4,153,933 | 5/1979 | Blume, Jr. et al. | 364/200 |
| 4,348,601 | 9/1982 | Kitamura | 307/568 |
| 4,433,393 | 2/1984 | Oritani | 365/203 |

FOREIGN PATENT DOCUMENTS 2851825 11/1978 Fed. Rep. of Germany .

Primary Examiner—Donald J. Yusko
Attorney, Agent, or Firm—Finnegan, Henderson, Farabow, Garrett & Dunner

[57] ABSTRACT

A bus line drive circuit comprising a bus line allowing data to transfer therethrough, a precharge circuit connected to the bus line for precharging the bus line with precharge pulse, input/output circuit connected to the bus line for transferring data to and from an ALU through the bus line, and positive feedback circuit connected to the bus line, which exhibits a high impedance during a precharge period to electrically be disconnected from the bus line, keeps a precharge potential when the potential on the bus line is equal to the precharge potential during an active period, and expands a potential difference when the potential on the bus line is slightly different from the precharge potential.

6 Claims, 12 Drawing Figures

FIG. 1
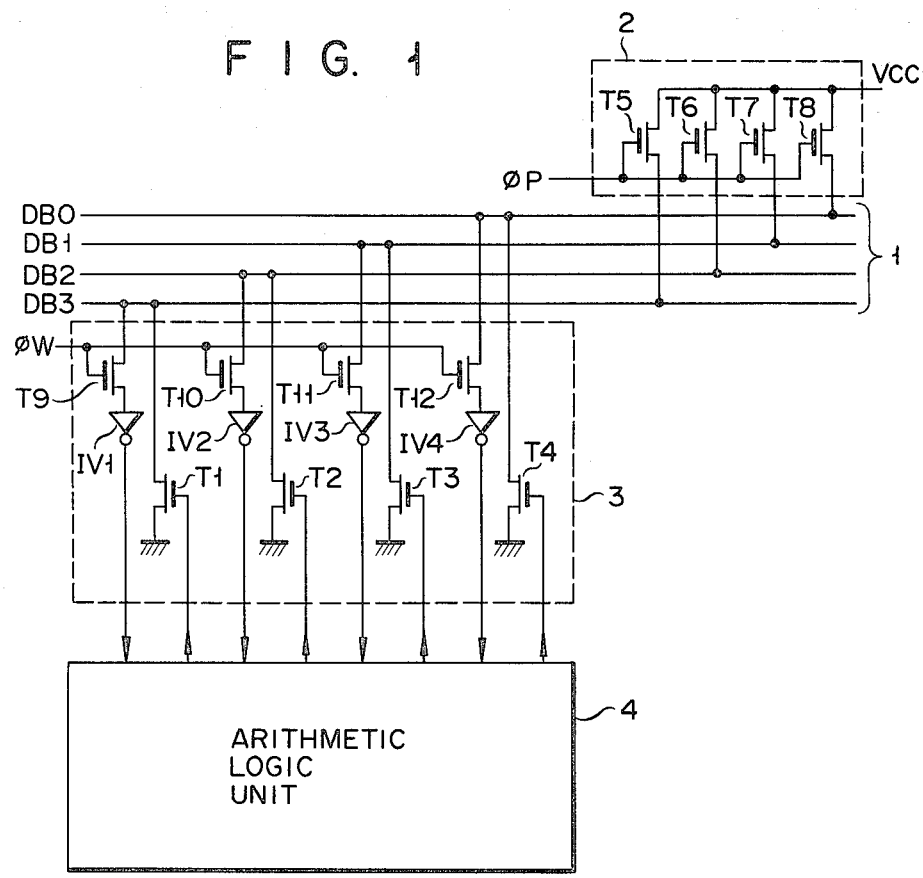
FIG. 2A ΦP
FIG. 2B BUS
FIG. 2C ΦW
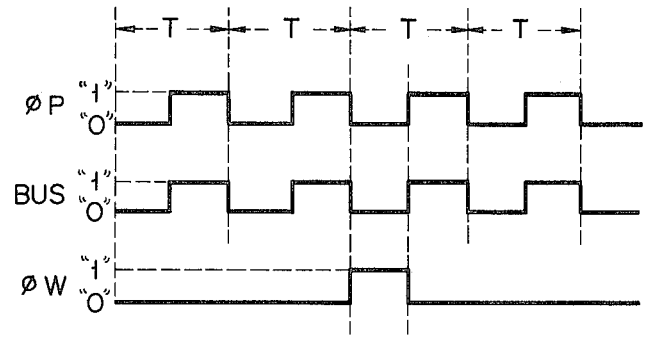

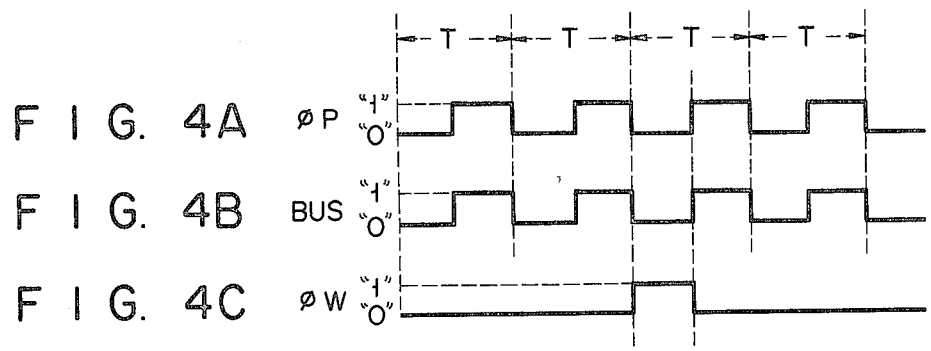
F I G. 4A  ØP
F I G. 4B  BUS
F I G. 4C  ØW
F I G. 6
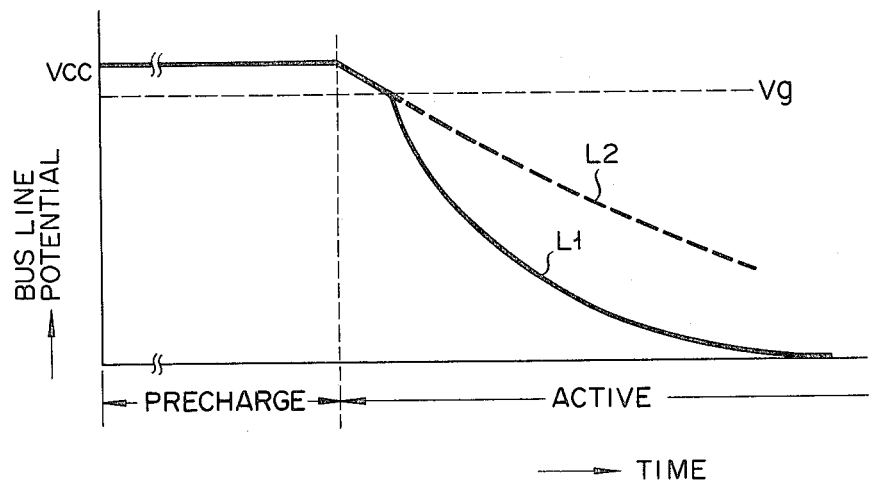

BUS LINE DRIVE CIRCUIT

BACKGROUND OF THE INVENTION

The present invention relates to a bus line drive circuit in a computer system of the type in which data is transferred through a bus line or lines.

In an integrated circuit (IC) forming a computer system, particularly in a large scale integrated circuit (LSI) forming a microcomputer system, bus lines are frequently used for data transfer. A prior bus line drive circuit for transferring data through a bus line is shown in FIG. 1. The bus line drive circuit is comprised of N-channel MOSFETs (metal oxide semiconductor field effect transistors) coupled with bus lines DB0 to DB3 for four bits, which are generally designated by reference numeral "1". The bus lines DB0 to DB3 are coupled with a precharge circuit 2 and an input/output (I/O) device 3 further connected to an arithmetic logic unit (ALU) 4, for example. The I/O device 3 is used as an interface circuit for transferring data between the ALU 4 and another ALU (not shown) through the bus line 1. The precharge circuit 2 precharges the bus line 1 every state (period) T, as shown in FIG. 2B. In operation, a clock pulse $\phi p$ (FIG. 2A) for precharge is applied to the gates of MOS transistors T5 to T8 constituting the precharge circuit 2. When the pulse $\phi p$ is in "1" level, the MOSFETs T5 to T8 are ON (in a low impedance state). And the currents flowing through the MOSFETs T5 to T8 charge bus lines DB0 to DB3 up to "1" level. When the pulse $\phi p$ is in "0" level, the MOSFETs T5 to T8 are OFF (in a high impedance state). During this period, no charge current flows, so that the bus lines DB0 to DB3 are not charged. Thus, the period that the pulse $\phi p$ is in "1" level is a precharge time, while the period that it is in "0" level is a non-precharge period, or an active period for the data transfer. The output MOSFETs T1 to T4 of the I/O device 3 constitute an output section of the I/O device 3. The output transistors T1 to T4 of the I/O device 3 are controlled so as to have a high impedance during the precharge period by the control gate (not shown) in the ALU 4. During an active period, the control gate so controls the transistors T1 to T4 to have a low impedance when the data to be outputted is "0" and to have a high impedance when the data is "1". Transistors T9 to T12 and inverters IV1 to IV4 connected to the MOS transistors T9 to T12 made up an input section of the I/O device 3. The input section is electrically coupled with the bus line 1 only during the active period for writing data by a clock signal $\phi w$ (FIG. 2C) applied to the gates of MOS transistors T9 to T12. During other periods, it is electrically disconnected from the bus line.

In an ordinary LSI, a number of I/O devices 3 are contained, but only one precharge circuit 2 is contained. Accordingly, even when the widths of the precharge transistors T5 to T8 are slightly widened to increase the conductance of the transistors T5 to T8 and finally to increase a charging speed, the overall area of the LSI is not so much increased. An ordinary LSI contains at least 10 output transistors T1 to T4 in the I/O device 3. Some LSIs contain 30 or more output transistors. For increasing the operating speed, the widths of these transistors T1 to T4 are selected to be relatively wide in the circuit design. For these reasons, the prior art involves some problems. The increase of the chip size is unavoidable. A parasitic capacitance of the bus line is increased since the area of the drain region is large, resulting in an adverse effect on the increase of the operation speed in the bus line drive circuit.

SUMMARY OF THE INVENTION

Accordingly, an object of the present invention is to provide a bus line drive circuit with a simple construction which can drive its associated drive lines without any increase of the chip size of the LSI.

According to the present invention, there is provided a bus line drive circuit comprising a bus line allowing data to transfer therethrough, a precharge circuit connected to the bus line for precharging the bus line with precharge pulse, input/output circuit connected to the bus line for transferring data to and from a circuit through the bus line, and a positive feedback circuit connected to the bus line, which exhibits a high impedance during a precharge period to electrically be disconnected from the bus line, keeps a precharge potential when the potential on the bus line is equal to the precharge potential during an active period, and expands a potential difference when the potential on the bus line is slight different from the precharge potential.

BRIEF DESCRIPTION OF THE DRAWINGS

FIG. 1 is a circuit diagram of a prior drive circuit of the type in which data is transferred through bus lines;

FIGS. 2A to 2C shown waveforms at key portions in the bus line drive circuit shown in FIG. 1;

FIGS. 4A to 4C illustrate waveforms of key portions in the circuit shown in FIG. 3;

FIG. 6 shows a variation of a potential on the bus line when the bus line drive circuit shown in FIG. 5 operates;

DETAILED DESCRIPTION OF THE PREFERRED EMBODIMENTS

Figure 3:
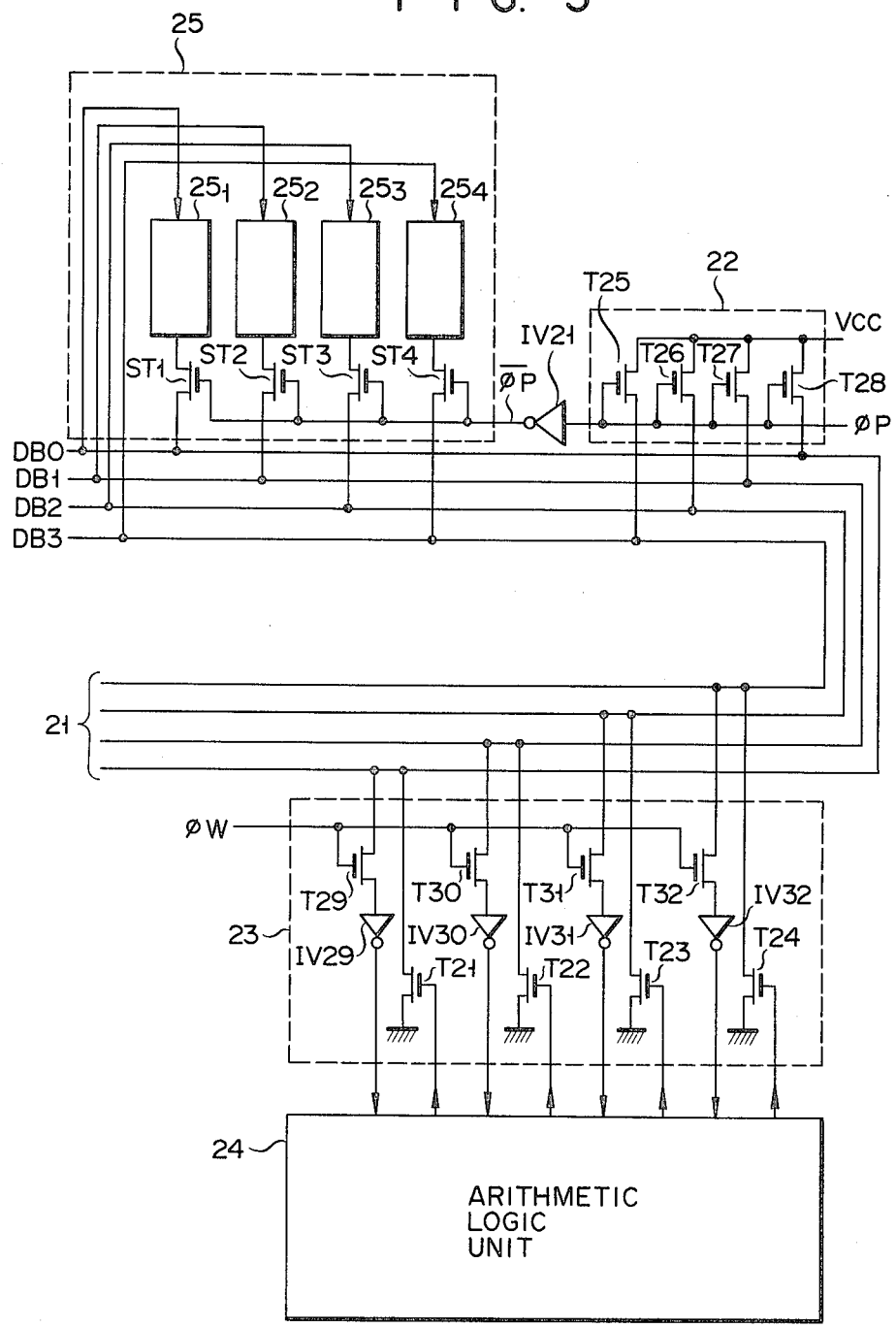
FIG. 3 is a circuit diagram of an embodiment of a bus line drive circuit according to the present invention.

Referring to FIG. 3, there is shown a bus line drive circuit according to the present invention when it is applied for a bus line 21 of four bits, like the bus line drive circuit shown in FIG. 1. The MOSFETs used in the circuit are of the N channel type. Bus lines DB0 to DB3 are generally designated by reference numeral 21. The bus line 21 is coupled with a precharge circuit 22 and an I/O device 23. The I/O device 23 is connected to an ALU 24. The positive feedback circuits $25_1$ to $25_4$ are connected to the bus lines DB0 to DB3, respectively. These positive feedback circuits are generally designated by reference numeral 25.

The bus line drive circuit is substantially the same as that of the prior one, except that the positive feedback circuit 25 is used.

The positive feedback circuits $25_1$ to $25_4$ receive the signals on the bus lines DB0 to DB3 during the other period than the precharge period to the bus lines DB0 to DB3. When the voltage levels of these signals are equal to the precharge level, the positive feedback circuits keep their voltage levels. When the voltage level is slightly shifted from the precharge level by a potential difference, the positive feedback circuit expands the potential difference. The feedback circuits $25_1$ to $25_4$ are so designed as not to produce the outputs during the precharge periods of the bus lines DB0 to DB3. In other words, these feedback circuits exhibit high impedance during the precharge period. In the drive circuit shown in FIG. 3, the feedback circuits $25_1$ to $25_4$ are connected to the bus lines DB0 to DB3 through MOS transistors ST1 to ST4 as analog switches which are turned on in response to a precharge pulse $\phi p$ when a precharge pulse $\phi p$ is phase-inverted by the inverter IV21.

A precharge circuit 22 is made up of four precharge MOSFETs T25 to T28 of which the drains are connected to a power source (not shown) at a positive potential Vcc and the sources are connected to the bus lines DB0 to DB3, respectively. The precharge clock pulse $\phi p$ as shown in FIG. 4A is applied to the gates of the MOSFETs T25 to T28.

The I/O device 23 is comprised of an input section including MOSFETs T29 to T32 and inverters IV29 to IV32 connected in series with the MOSFETs T29 to T32, and an output section including MOSFETs T21 to T24. The drains of the input transistors T29 to T32 are respectively connected to the bus lines DB0 to DB3, and the sources to an ALU 24 through the inverters IV29 to IV32, respectively. A write pulse $\phi w$ is inputted to the gates of the input MOSFETs T29 to T32. The drains of the output MOSFETs T21 to T24 are connected to the bus lines DB0 to DB3, respectively, and the sources to ground. The gate of the output MOSFETs T21 to T24 are connected to the ALU 24. The I/O device 23 serves as an interface for transferring data between the ALU 24 and another ALU (not shown) through the bus line 21.

The precharge circuit 22 precharges the bus line 21 every period (state) T, as shown in FIG. 4A. A clock pulse $\phi p$ (FIG. 4A) is inputted to the gates of the MOS transistors T25 to T28. During the period that the clock pulse $\phi p$ is in "1" level, the MOSFETs T25 to T28 are ON or in a low impedance state. During this period, the charge current flows into the bus lines DB0 to DB3 through the drain-source paths of the MOSFETs T25 to T28. The charge current raises the bus lines DB0 to DB3 to "1" level. During the period that the pulse $\phi p$ is in "0" level, the MOSFETs T25 to T28 are OFF or in a high impedance and no charge current flows into the MOSFETs T25 to T28. Accordingly, in this case, the bus lines DB0 to DB3 are not charged. The period that the pulse $\phi p$ is in "1" level is a precharge period and the period that it is in "0" level is a non-precharge period or an active period.

The output MOSFETs T21 to T24 of the I/O device 23 are controlled by the corresponding control gates (not shown) in the ALU 24. The output transistors T21 to T24 are so controlled as to be ON when the data to be outputted is "0" and OFF when it is "1". These transistors under this control produce "1" and "0" signals to the bus lines DB0 to DB3. The input MOSFETs T29 to T32 are controlled by the write clock pulse $\phi w$ (FIG. 4C) to be electrically connected to the bus line 21 only during the active period that the write clock signal $\phi w$ is in "1" level, that is, in a write mode. During other periods, these transistors are OFF to be electrically disconnected from the bus lines DB0 to DB3. In this way, data is written into the ALU 24.

Figure 5:
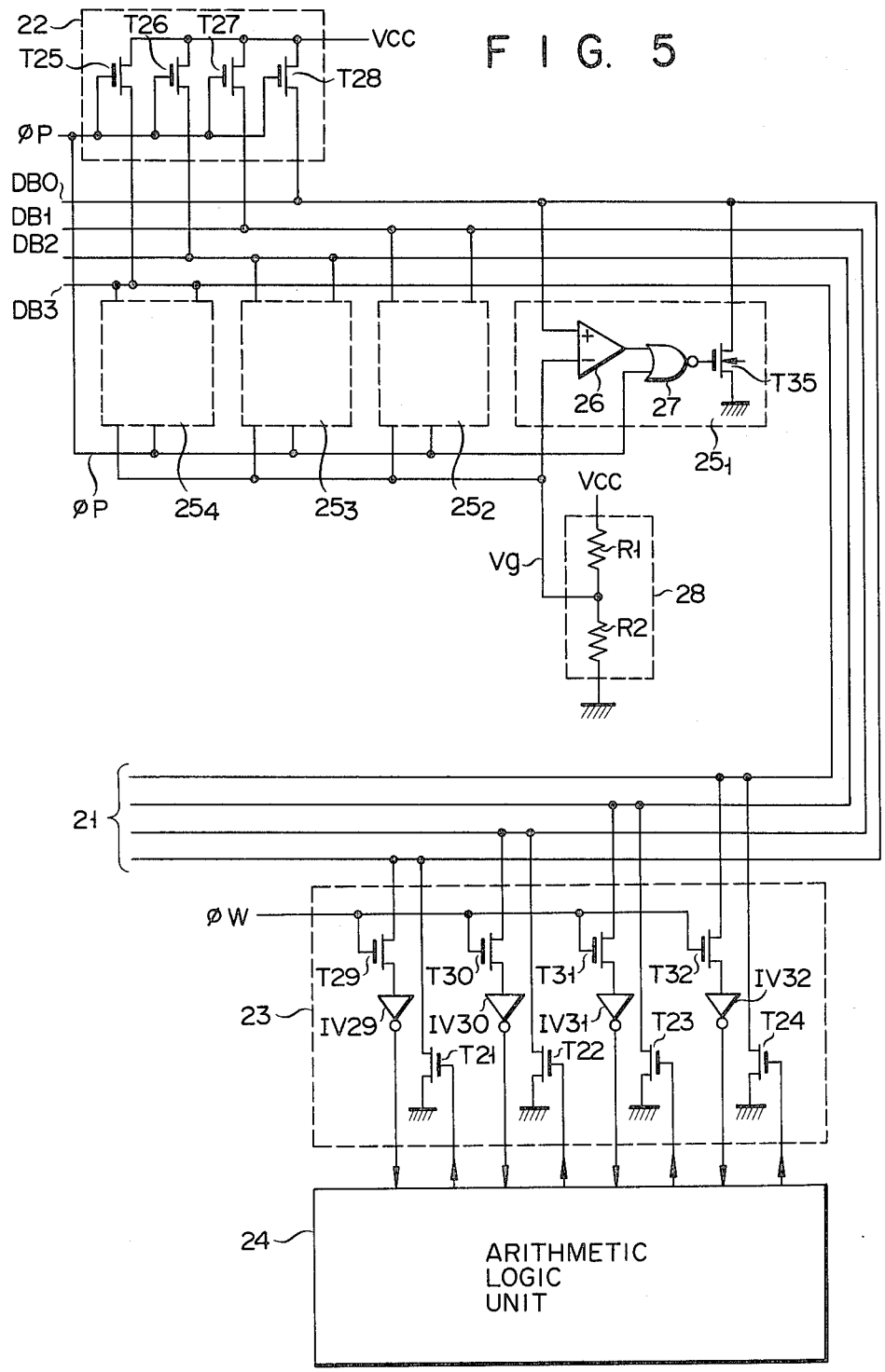
FIG. 5 is a circuit diagram of a positive feedback circuit, which is substantially equal to the bus line drive circuit shown in FIG. 3.

FIG. 5 is a practical arrangement of a positive feedback circuit $25_1$, of which the circuit arrangement is substantially the same as the bus line drive circuit shown in FIG. 3. Therefore, explanation to follow is given placing an emphasis on the positive feedback circuit $25_1$.

The feedback circuit $25_1$ is comprised of a comparator 26 which is connected at the non-inverted input terminal to the bus line DB0 and at the inverted input terminal ($-$) to a reference potential $V_G$, a NOR gate 27 which is connected at one input terminal to the output of the comparator 26 and receives at the other input terminal the precharge pulse $\phi p$, and a MOSFET T35 which is connected at the gate to the output terminal of the NOR gate 27, at the drain to the bus line DB0, and at the source to the ground. The circuit arrangement of the positive feedback circuit $25_1$ is the same as those of the remaining circuit $25_2$ to $25_4$. A circuit 28 for generating a reference potential Vg for the comparator 26 is comprised of a couple of resistors R1 and R2 connected in series between a positive potential source Vcc and ground. A junction point between these transistors is connected to the inverted input terminal ($-$) of the comparator 26. The inverted input terminal ($-$) of the comparator 26 is connected to a junction between the resistors R1 and R2. With this connection, the reference potential Vg is applied to the inverted input terminal ($-$) of the comparator 26.

In the feedback circuit $25_1$, the comparator 26 compares the potential on the bus line DB0 and the reference potential Vg. When the bus line potential is larger than the reference potential Vg, the output of the comparator 26 is kept at the potential on the bus line DB0. In the inverse state of these potentials, the output signal from the comparator 26 rapidly falls off toward ground. The output signal from the comparator 26 is inputted to one of the input terminals of the NOR gate 27. The precharge pulse $\phi p$ is applied to the other input terminal of the NOR gate 27. The output signal from the NOR gate 27 is applied to the gate of the MOSFET T35 to control ON and OFF of the MOSFETs T35.

The operation of the drive circuit shown in FIG. 5 will be given referring to timing charts of FIGS. 4A to 4C. During the precharge periods of the bus lines DB0 to DB3, the precharge pulse $\phi p$ is in "1" level and the output signal from the NOR gate 27 is in "0" level, and the MOSFET T35 is OFF. Under this condition, the feedback circuit $25_1$ is electrically disconnected from the bus line DB0 and the bus line DB0 is at the potential $V_{CC}$ or in "1" level. In an active period following the precharge period, the MOSFET T35 is controlled by the output signal from the comparator 26 through the NOR gate 27.

When the output MOSFET T21 in the I/O device $25_1$ connected to the bus line DB0 produces data of "0" level, the bus line DB0 gradually falls off toward the ground potential. When the potential on the bus line DB0 falls below the reference potential Vg, the output signal from the NOR gate 27 changes from "0" to "1" in level, the output of the NOR gate 27 is "1" in level to turn on the MOSFET T35. Then, the potential on the bus line DB0 rapidly falls off as indicated by a curve L1 in FIG. 6. As shown, the potential on the bus line DB0 gently falls up to the reference potential Vg, and then sharply falls off toward the ground potential. In FIG. 6, a curve L1 is given by the drive circuit according to the present invention, and a curve L2 by the prior drive circuit. When the output MOSFET T21 produces a "1" level signal, the bus line DB0 dynamically holds the "1" level, and therefore the output level of the comparator 26 is kept in "1" state. As a result, the MOSFET T35 is kept OFF, and the feedback circuit $25_1$ is kept high in impedance. In other words, when the signal level on the bus line DB0 is equal to the precharge level, the potential on the bus line DB0 is kept as it is, i.e. in precharge level.

As seen from the foregoing, in the bus line drive circuit with the positive feedback circuit 25 according to the present invention, when the I/O device 23 produces "0" level data, a rapid decrement of the potential on the bus line 21 is allowed thereby realizing a high speed operation of the bus line. An additional and notable feature of the drive circuit of the invention is the provision of a single feedback circuit for each of the bus lines. This feature gives us little increase of the chip size.

Furthermore, even if a large number of the I/O devices 23 are contained in the drive circuit of the invention, there is no need for especially increasing the widths of the output MOSFETs T21 to T24 of the I/O device 23 in order to speed up the operation of the device. The ALU connected to the I/O device may be replaced by any other suitable circuit such as a memory device.

Figure 7:
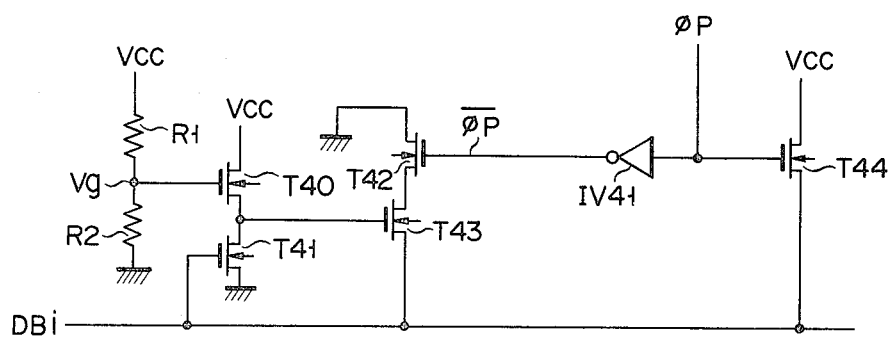
FIG. 7 shows a circuit diagram of another positive feedback circuit.

Turning now to FIG. 7, there is shown another example of the positive feedback circuit 25. In the circuit, all MOSFETs are of the N channel type. A MOSFET T40 is connected at the drain with a positive potential $V_{CC}$, at the gate to a junction between resistors R1 and R2 connected in series between a positive potential $V_{CC}$ and ground, receiving the reference potential Vg. A MOSFET T41 is connected at the drain to the source of the MOSFET T40, at the source to the ground and at the gate to the bus line DBi (i is 0, 1, . . . ). The MOSFETs T40 and T41 form a comparator. A MOSFET T42 connected at the source to ground receives at the gate the precharge pulse $\overline{\phi}p$ phase-inverted by an inverter IV41. A MOSFET T43 is connected at the source to the drain of the transistor T42 and at the drain to the bus line DBi, and at the gate to a junction between the source of the transistor T40 and the drain of the transistor T41. The MOSFETs T42 and T43 form a NOR gate. A MOSFET T44 is connected at the drain to the positive potential $V_{CC}$ and at the source to the bus line DBi and receives at the gate the precharge pulse $\phi$p.

In operation, when the precharge pulse $\phi$p is in "1" level, the MOSFET T44 is turned on to allow a charge current to flow through its drain-source path into the bus line DBi. In this case, the precharge pulse $\overline{\phi}p$ inverted by the inverter IV41 is inputted to the gate of the FET T42, resulting in OFF of the transistor T42. In this situation, since the MOSFET T41 is ON, the gate of the FET T43 is at ground potential and the MOSFET T43 is OFF. As the result of OFF of these transistors T42 and T43, the bus line DBi is electrically disconnected from ground and the bus line DBi is pulled up to "1" level by the charge current flowing through the MOSFET T44.

When the precharge pulse $\phi$p is in "0" level, the MOSFET T44 is OFF and no charge current flows therethrough. In this case, when the phase-inverted precharge pulse $\overline{\phi}p$ is applied to the gate of the transistor T42 to be turned on.

It is assumed that when the pulse $\phi$p is in "0" level, i.e. in the active period, the I/O device (not shown in FIG. 7) connected to the bus line DBi produces data of "0" level. In this case, the potential on the bus line DBi gradually decreases. When it is below the reference potential Vg, the MOSFET T41 is OFF, while the MOSFET T40 is ON. The result is that the MOSFET T43 is ON. When both the transistors are ON, the potential on the bus line DBi rapidly falls to ground level.

When in the active period, the I/O device (not shown) connected to the bus line DBi produces "1" level data, the potential on the bus line DBi does not fall and it is kept in the precharge level or the "1" level. The result is that the MOSFET T41 is ON, the MOSFET T43 is OFF, and the bus line DBi keeps its "1" level.

Figure 8:
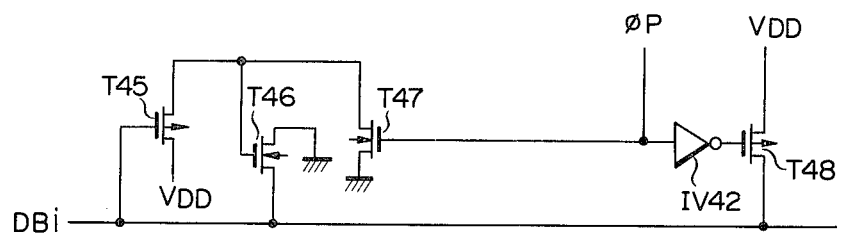
FIG. 8 shows a circuit diagram of yet another feedback circuit.

FIG. 8 shows yet another example of the positive feedback circuit. In the circuit, the comparator is a CMOS arrangement. A P channel T45 is connected at the drain to the positive potential $V_{DD}$ and at the gate to the bus line DBi. An N channel MOSFET T46 is connected at the gate to the source of the P channel MOSFET T46, at the source to ground, and at the drain the bus line DBi. The transistors T45 and T46 make up a CMOS comparator. An N channel MOSFET T47 is connected at the drain to the source of the MOSFET T45 and the gate of the MOSFET T46, and received at the gate the precharge pulse $\phi$p. A P channel MOSFET T48 is coupled at the drain with the positive potential $V_{DD}$ and at the source to the bus line DBi, and receives at the gate the precharge pulse $\phi$p through the inverter IV4.

In operation, when the precharge pulse $\phi$p is in "1" level, the precharge pulse $\phi$p passing through the inverter IV42 is applied to the gate of the P channel MOSFET T48. Then, the transistor T48 is ON to allow the charge current to flow into the bus line DBi, so that the bus line DBi is charged up to "1" level. At this time, the precharge signal $\phi$p is directly applied to the gate of the N channel MOSFET T47, so that the MOSFET T47 is ON. Upon ON of the transistor, the charge stored in the transistor T45 is discharged into the MOSFET T47. The P channel MOSFET T45 is OFF when the bus line DBi is in "1" level. Accordingly, the N channel MOSFET T46 is OFF. During the precharge period, the bus line DBi is disconnected from ground, with the result that the bus line DBi is charged to the "1" level and its state is kept.

It is assumed that during the active period, the I/O device (not shown) connected to the bus line DBi produces "0" level data. In this case, when the potential on the bus line DBi falls below $(V_{DD}-Vth)$ (where Vth is a threshold voltage of the p channel MOSFET T45), the MOSFET T45 is ON and the N channel MOSFET T46 is also ON. As the result of ON of the transistor T46, the potential on the bus line DBi rapidly decreases to ground potential.

The I/O device (not shown) connected to the bus line DBi produces data of "1". In this case, the bus line DBi potential is kept in "1" level and therefore the P channel MOSFET T45 is kept OFF. The result is that the OFF state of the transistor T46 and the "1" state on the bus line DBi is kept. Thus, in the feedback circuit shown in FIG. 8, the threshold voltage Vth of the P channel MOSFET T45 is used for the reference potential Vg. The bus line drive circuit containing the feedback circuit shown in FIG. 8 can attain similar effects to those of the drive circuit shown in FIGS. 3 and 5. Since the comparator in the FIG. 8 circuit is of the CMOS type, the power is saved.

As seen from the foregoing description, the positive feedback circuit, connected to the bus line connecting to the precharge circuit, exhibits a high impedance to electrically be disconnected from the bus line during the charge period. When the potential on the bus line is equal to the precharge potential during the active period, the feedback circuit keeps the precharge potential. When the potential on the bus line is slightly different from the precharge potential, the feedback circuit expands its difference. With this connection, the drive circuit is simple in circuit construction and can drive the bus line at high speed with no increase of the LSI chip size.

Some examples of the positive feedback circuits may be modified variously within the scope of the present invention.

What we claim is:

1. A bus line drive circuit comprising:
a bus line allowing data to transfer therethrough;
a precharge circuit connected to said bus line for precharging said bus line with precharge pulse;
input/output circuit connected to said bus line for transferring data to and from a circuit through said bus line; and
a positive feedback circuit connected to said bus line, which exhibits a high impedance during a precharge period to electrically be disconnected from said bus line, keeps a precharge potential when the potential on said bus line is equal to the precharge potential during an active period, and expands a potential difference when the potential on said bus line is slightly different from the precharge potential.

2. A bus line drive circuit according to claim 1, wherein said positive feedback circuit includes comparative means for comparing the potential on said bus line and a reference potential, a NOR gate for receiving an output signal from said comparator means and a precharge pulse, and a MOSFET connected at the gate to the output of said NOR gate and at the drain to said bus line, and coupled at the source with a predetermined potential.

3. A bus line drive circuit according to claim 1, wherein said positive feedback circuit includes comparator means for comparing a potential on said bus line with a reference potential, inverter means for phase-inverting a precharge pulse; and a NOR gate for receiving an output signal from said comparator means and a precharge pulse derived from said inverter means.

4. A bus line drive circuit according to claim 3, wherein said comparator means includes first and second MOSFETs connected in series between first and second potentials, a reference signal being applied to the gate of said first MOSFET, and the gate of said second MOSFET being connected to said bus line, and said NOR gate includes third and fourth MOSFETs connected in series between said bus line and said second power potential, the gate of said third MOSFET being connected to a junction between said first and second MOSFETs, and the gate of said fourth MOSFET being connected to said inverter means so as to receive a precharge pulse phase inverted.

5. A bus line drive circuit according to claim 1, wherein said positive feedback circuit includes comparator means of the CMOS type including a first MOSFET of a first channel type connected between said bus line and a first power potential source, and a second MOSFET of a second channel type, connected between a second power potential source and the gate of said first MOSFET, of which the gate is connected to said bus line.

6. A bus line drive circuit according to claim 5, wherein a third MOSFET of the first channel type is connected to said second MOSFET of the first channel type, which receives at the gate a precharge signal and discharges charges stored dynamically in said second MOSFET.

* * * * *